(12) United States Patent
Ebergen et al.

(10) Patent No.: US 8,027,425 B1
(45) Date of Patent: Sep. 27, 2011

(54) ASYNCHRONOUS LOADABLE DOWN COUNTER

(75) Inventors: Josephus C. Ebergen, San Francisco, CA (US); Adam Megacz, Berkeley, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 12/752,891

(22) Filed: Apr. 1, 2010

(51) Int. Cl.
*G06M 3/00* (2006.01)
*H03K 21/00* (2006.01)
(52) U.S. Cl. .................... 377/26; 377/33; 377/118
(58) Field of Classification Search .................... None
See application file for complete search history.

(56) References Cited

U.S. PATENT DOCUMENTS

| | | | |
|---|---|---|---|
| 6,700,410 B2 * | 3/2004 | Ebergen .................... | 326/93 |
| 7,085,341 B2 * | 8/2006 | Wells ...................... | 377/26 |
| 7,518,646 B2 * | 4/2009 | Zarnowski et al. ........ | 348/302 |

OTHER PUBLICATIONS

Kessels, Joep et al., "Designing Asynchronous Standby Circuits for a Low-Power Pager", pp. 257-267, Proceedings of the IEEE, vol. 87, No. 2, Feb. 1999.
Ebergen, Jo et al., "Kessels's Loadable Down Counter and Stable Encodings", Nov. 12, 2009, pp. 1-17, SML#: 2009-0505.

* cited by examiner

*Primary Examiner* — Tuan Lam
(74) *Attorney, Agent, or Firm* — Park, Vaughan, Fleming & Dowler LLP

(57) ABSTRACT

The disclosed embodiments relate to an asynchronous down counter, which can be loaded with any value N and then decrement exactly N times. The counter comprises an array of cells, wherein each cell is configured to hold a digit in a redundant base-k representation of a number contained in the array of cells. Each cell further comprises a finite state machine that defines state transitions between states, where these states are held on wires and state transitions are synchronized between neighboring cells. Each cell is further configured to asynchronously borrow, if possible, from a more significant adjacent cell to increase a value of a digit in the cell. This asynchronous borrowing improves performance by ensuring that a decrement operation, which decrements a digit in a least significant cell in the array, will borrow from an adjacent more significant cell, without having to wait for the completion of a rippling sequence of borrows from more significant cells.

20 Claims, 11 Drawing Sheets

```
state L where
    L = ( load -> if bN then S1
                           else S0 )
    S1 = ( dnS1 -> S0 )
    S2 = ( dnS2 -> S1 )
    S0 = ( s.dnS2 -> S2
         | s.dnS1 -> S2
         | s.dnU -> EMPTY )
    EMPTY = ( dnU -> L )
end
```

```
state L where
    L = ( load -> EMPTY )
    S1 = ( dnS1 )
    S2 = ( dnS2 )
    EMPTY = ( dnU -> L )
end
```

FIG. 3A             FIG. 3B state L where
    L = ( load -> if bN then S1
                        else S0 )
    S1 = ( dnS1 -> S0 )
    S2 = ( dns2 -> S1 )
    S0 = ( s.dnS2 -> S2
       | s.dnS1 -> S2
       | s.dnU -> EMPTY )
    EMPTY = ( dnU -> L)
end
FIG. 4A
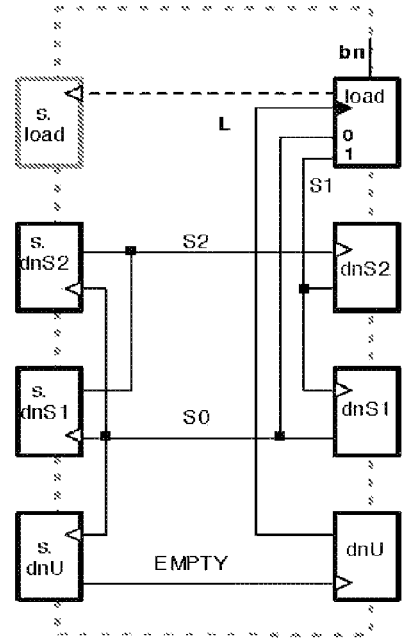
FIG. 4B
state L where
    L = ( load -> EMPTY )
    S1 = ( dnS1 )
    S2 = ( dns2 )
    EMPTY = ( dnU -> L)
end
FIG. 4C
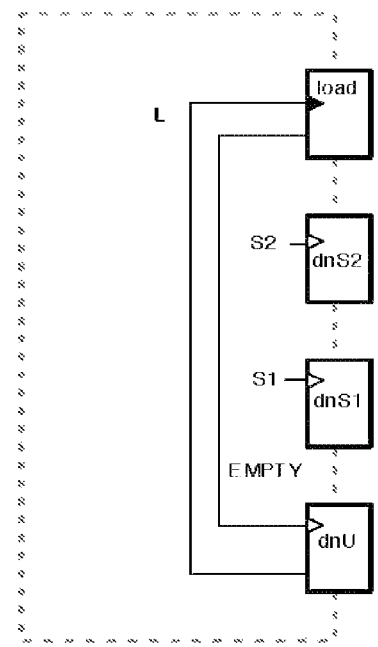
FIG. 4D

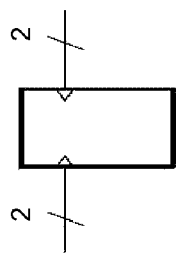
FIG. 8A
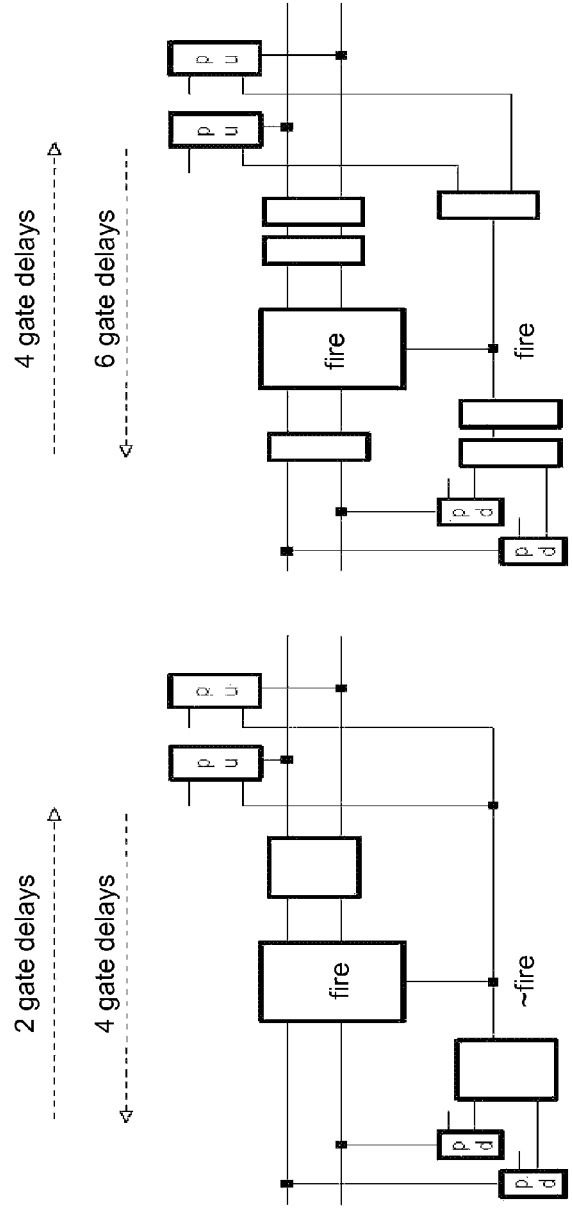
FIG. 8C
FIG. 8B

ASYNCHRONOUS LOADABLE DOWN COUNTER

BACKGROUND

1. Field

The disclosed embodiments relate to implementations of down counters. More specifically, the disclosed embodiments relate to asynchronous implementations of a loadable down counter.

2. Related Art

A loadable down counter is a circuit that can be loaded with any k-digit value N and then decrement exactly N times. This series of operations can then be repeated for different values of N. Loadable down counters are used often in hardware implementations to execute a certain set of operations N times, where the value of N may depend on user-provided information. Loadable down counters have been implemented as both synchronous and asynchronous circuits. For example, Joep Kessels describes an asynchronous implementation of a loadable down counter in "Designing Asynchronous Standby Circuits for a Low-Power Pager, J. Kessels and P. Marston, *Proceedings of the IEEE, Special Issue on Asynchronous Circuits and Systems*, Vol. 87, No. 2, February 1999. In this paper, Kessels specifies the down counter in the Tangram language, and the implementation comprises a translation of the specification into a handshake circuit. Unfortunately, these handshake circuits are slower, use greater area, and consume more power than other implementations.

Hence, what is needed are circuit implementations of a loadable down counter that are faster, use less area, and consume less power than previous implementations.

SUMMARY

The disclosed embodiments relate to an asynchronous down counter, which can be loaded with any value N and then decrement exactly N times. The counter comprises an array of cells, wherein each cell is configured to hold a digit in a redundant base-k representation of a number contained in the array of cells. Each cell further comprises a finite state machine that defines state transitions between states, where these states are held on wires and state transitions are synchronized between neighboring cells. Each cell is further configured to asynchronously borrow, if possible, from a more significant adjacent cell to increase a value of a digit in the cell. This asynchronous borrowing improves performance by ensuring that a decrement operation, which decrements a digit in a least significant cell in the array, will borrow from an adjacent more significant cell, without having to wait for the completion of a rippling sequence of borrows from more significant cells.

In some embodiments, each digit in the redundant base-k representation of a number is a redundant base-2 digit.

In some embodiments, a loading circuit is configured to load a number N into the array of cells.

In some embodiments, the finite state machine in each cell is configured to encode each state on a single wire.

In some embodiments, the finite state machine in each cell is configured to encode each state on multiple wires.

In some embodiments, each cell includes a GasP module.

In some embodiments, the GasP module is implemented by a 2-4 GasP circuit, wherein the circuit has two gate delays in the forward direction and four gate delays in the reverse direction, and wherein the circuit has a cycle time of six gate delays.

In some embodiments, a state wire is maintained at a current state by a keeper circuit when the wire is not actively driven.

BRIEF DESCRIPTION OF THE FIGURES

FIG. 3A shows a specification of a cell in a loadable down counter in accordance with an embodiment of the present invention.

FIG. 3B shows the specification of an end cell in a loadable down counter in accordance with an embodiment of the present invention.

FIG. 4A shows the specification of a cell for a loadable down counter in accordance with an embodiment of the present invention.

FIG. 4B shows the implementation of a cell for a loadable down counter in accordance with an embodiment of the present invention.

FIG. 4C shows the specification of an end cell for a loadable down counter in accordance with an embodiment of the present invention.

FIG. 4D shows the implementation of an end cell for a loadable down counter in accordance with an embodiment of the present invention.

FIGS. 8A-8C show an implementation of a generalized GasP module with two gate delays in the forward direction and four gate delays in the reverse direction in accordance with an embodiment of the present invention.

Figures 1A, 1B:
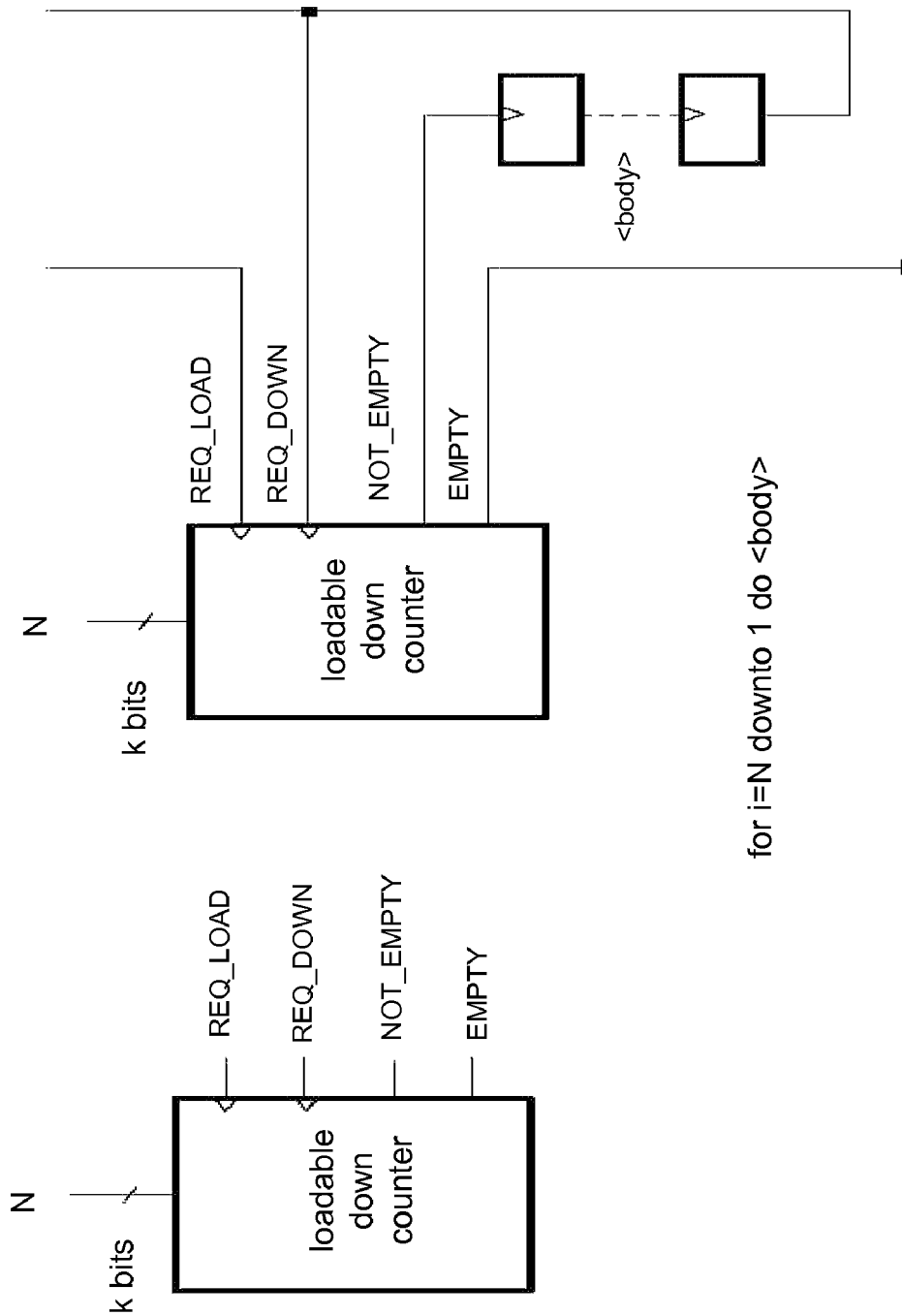
FIG. 1A shows a loadable down counter in accordance with an embodiment of the present invention.
FIG. 1B shows an implementation of a repetition involving a loadable down counter in accordance with an embodiment of the present invention.

Table 1 illustrates a table of transitions for neighboring bit values in accordance with an embodiment of the present invention.

Table 2 illustrates a table of transitions of neighboring bit values and their associated state transition names in accordance with an embodiment of the present invention.

Table 3 illustrates a state encoding using two wires in accordance with an embodiment of the present invention.

Table 4 illustrates state transitions with new state encoding in accordance with an embodiment of the present invention.

In the figures, like reference numerals refer to the same figure elements. Moreover, multiple instances of the same type of part may be designated by a common prefix separated from an instance number by a dash.

DETAILED DESCRIPTION

Embodiments provide a method and apparatus for implementing a down counter. More specifically, embodiments provide a method and apparatus for implementing a loadable down counter using GasP circuit implementations together with new state encoding techniques.

Several embodiments of implementations of Kessels's down counter are presented which use a new state encoding technique. In all previous GasP implementations, each state was mapped to a single state wire using a one-hot encoding. To save on state wires and potentially some logic in the GasP modules, it is useful to consider different state encodings that use less than one wire per state. By way of illustration, several implementations of the counter are presented that use a state encoding using fewer state wires. The GasP implementations are much faster, use less area, and consume less power than the Handshake Solutions implementation. For this reason the GasP implementations can be used for high-frequency and low-power applications.

A loadable down counter first loads an arbitrary value N in binary format after which it will perform N successful decrements, denoted by dnS, finally followed by an unsuccessful decrement, denoted by dnU. The down counter then repeats this behavior. Here is the specification in the form of a program.

$$*[load(N) \rightarrow dnS^N \rightarrow dnU]$$

where *[E] denotes repetition of E, $\rightarrow$ denotes concatenation, and $dnS^N$ denotes action dnS repeated N times.

FIG. 1A illustrates a possible interface of the down counter with a user in accordance with some embodiments of the present invention. Wire REQ_LOAD is for requesting a load action. Assume that the binary value N is valid when a request for a load action occurs. Wire REQ_DOWN is for requesting a down action, wire NOT_EMPTY is for acknowledging a successful down action, and wire EMPTY is for acknowledging an unsuccessful down action.

Loadable down counters are handy when implementing repetitions of the form:

for i=1 to N do S where N is not known beforehand, but gets calculated just before execution of the repetition. Also assume that statement S does not use or change the value of i. FIG. 1B illustrates an implementation of this repetition using a loadable down counter in accordance with some embodiments of the present invention.

In order to describe our implementation, the behavior of the counter is first illustrated by means of an example. Assume that a six-bit counter is loaded with the binary value The left-most bit is the most significant bit. Thus, this binary representation denotes the value $1*2^5+0*2^4+0*2^3+1*2^2+0*2^1+1*2^0=37$. Although the initial count is in a unique binary representation, during operation the counter can assume a redundant representation of the count by allowing each "bit" to assume one of three values 0, 1, and 2. Using this notation, the following are valid representations for 37.

020021
012021
011221

During operation, any bit that has a value 0 will borrow a 1 from its more significant neighbor, if it exists and if it has a non-zero bit value. A borrow from a more significant neighbor results in adding 2 to the bit's own value of 0, which results in a 2. So, for example, the sequence . . . 10 . . . changes to . . . 02 . . . and the sequence . . . 20 . . . changes to . . . 12 . . . .

In order to test if the value of the counter is zero, the system needs to test if all bit values are zero. To avoid testing that all bit values are 0, the system needs one more bit value, that is, a value that indicates that all more significant bits are 0. Call this bit value E for "Empty." The additional rule for transitioning bit values is that when a bit value is 0 and its more significant neighbor has bit value E, then the new bit value changes from 0 to E. By default the left-most bit is always E. With these definitions, it follows that whenever the least significant bit equals E, then the counter value is 0.

Taking into account the above rules for transitioning bit values, the following sequence of representations can occur during operation. Note that more than one transition may occur in any representation. For example, decrementing EE11202 not only decrements the least significant bit 2, but also borrows a 1 from the first 2 of 202 to form 121.

| | |
|---|---|
| E011221 | |
| EE11221 | |
| | −1, dnS, successful decrement |
| EE11220 | |
| EE11212 | |
| | −1, dnS, successful decrement |
| EE11211 | |
| | −1, dnS, successful decrement |
| EE11210 | |
| EE11202 | |
| | −1, dnS, successful decrement |
| EE11121 | |
| . . . | |
| EEEEEE1 | |
| | −1, dnS, successful decrement |
| EEEEEE0 | |
| EEEEEEE | |
| | −1, dnU, unsuccessful decrement |
| EEEEEEE | |

Tale 1 summarizes the transitions of two neighboring bit values, called MSN for "more significant neighbor" and LSN for "less significant neighbor," in accordance with some embodiments of the present invention. The table gives the neighboring bit values before the transitions in both bits and after the transitions. The transition is called the "firing."

TABLE 1

Table of transitions for neighboring bit values

| Before firing | | After firing | |
|---|---|---|---|
| MSN | LSN | MSN | LSN |
| E | 0 | E | E |
| 1 | 0 | 0 | 2 |
| 2 | 0 | 1 | 2 |
| 0 | 0 | 0 | 0 |

For a k-bit loadable down counter, Kessels uses one cell per bit plus a special end cell. The communication behavior of each cell with its neighbors can be described with a finite state machine. The complete counter is then the parallel composition of all finite state machines.

Figure 2:
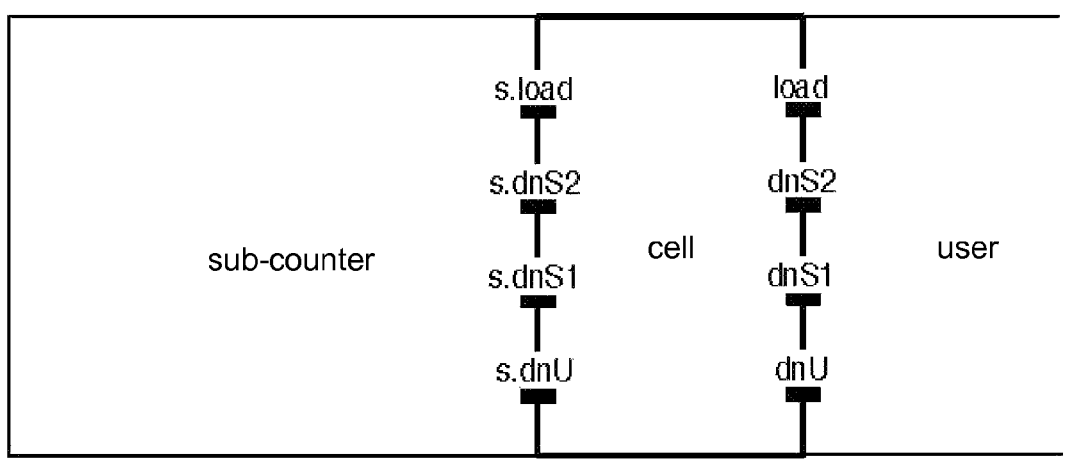
FIG. 2 shows a counter comprising a cell communicating with a sub-counter and a user, in accordance with an embodiment of the present invention.

Whereas the end cell communicates with just one neighbor, all other cells communicate with two neighbors. The behavior of one such cell can be specified as a sequence of communication actions between the user and the cell on the one hand and between the cell and the sub-counter on the other hand, as illustrated in FIG. 2 in accordance with some embodiments of the present invention. The communication actions between two neighboring cells appear in Table 2 in accordance with some embodiments of the present invention. For our specification these actions serve as the communication actions between user and cell. In order to distinguish these actions from the communication actions between the cell and the sub-counter, prefix the actions with the sub-counter with "s." to obtain s.dnU, s.dnS1, and s.dnS2. There also exists one more communication action representing the loading of the bit value into the cell: load and s.load.

TABLE 2

Table of transitions of neighboring bit values and their associated state transition names

| Before firing | | After firing | | Action |
|---|---|---|---|---|
| MSN | LSN | MSN | LSN | Name |
| E | 0 | E | E | dnU |
| 1 | 0 | 0 | 2 | dnS1 |
| 2 | 0 | 1 | 2 | dnS2 |
| 0 | 0 | 0 | 0 | — |

Each cell can be in one of five states: L, S0, S1, S2 and EMPTY. State L is the initial state, where the cell performs a load action with the user and then goes to state S0, if the bit loaded is 0, or to state S1, if the bit loaded is 1. States S0, S1, and S2 are the states of the cell where the value of the bit stored in the cell is 0, 1, or 2 respectively. In state EMPTY the value of the bit stored in the cell is E.

The specification of a cell appears in FIG. 3A where bN represents the bit value for that cell in accordance with some embodiments of the present invention. In state S2, the cell performs a successful down action and goes to state S1. In state S1, the cell performs a successful down action and goes to state S0. In state S0 the cell tries to borrow a bit from its sub-counter by performing a down action on the sub-counter. If the sub-counter performs a successful down action, the cell goes to state S2. If the sub-counter performs an unsuccessful down action, the cell goes to state EMPTY. In state EMPTY, the cell performs an unsuccessful down action with the user and then goes to state L, waiting for the next load action.

A specification for the end cell appears in FIG. 3B in accordance with some embodiments of the present invention. The specification includes all actions load, dnS1, dnS2, and dnU, although dnS1 and dnS2 are never activated. This means that the last cell will prevent actions dnS1 and dnS2 from ever occurring.

A GasP implementation of the counter cells using a one-hot encoding appears in FIGS. 4A-4D in accordance with some embodiments of the present invention. The one-hot encoding technique assigns one wire to every state and one GasP module to every state transition. Note that each GasP module is part of two neighboring finite state machines. Thus, a GasP module fires only when both finite state machines can engage in the state transition implemented by the GasP module.

Figure 5:
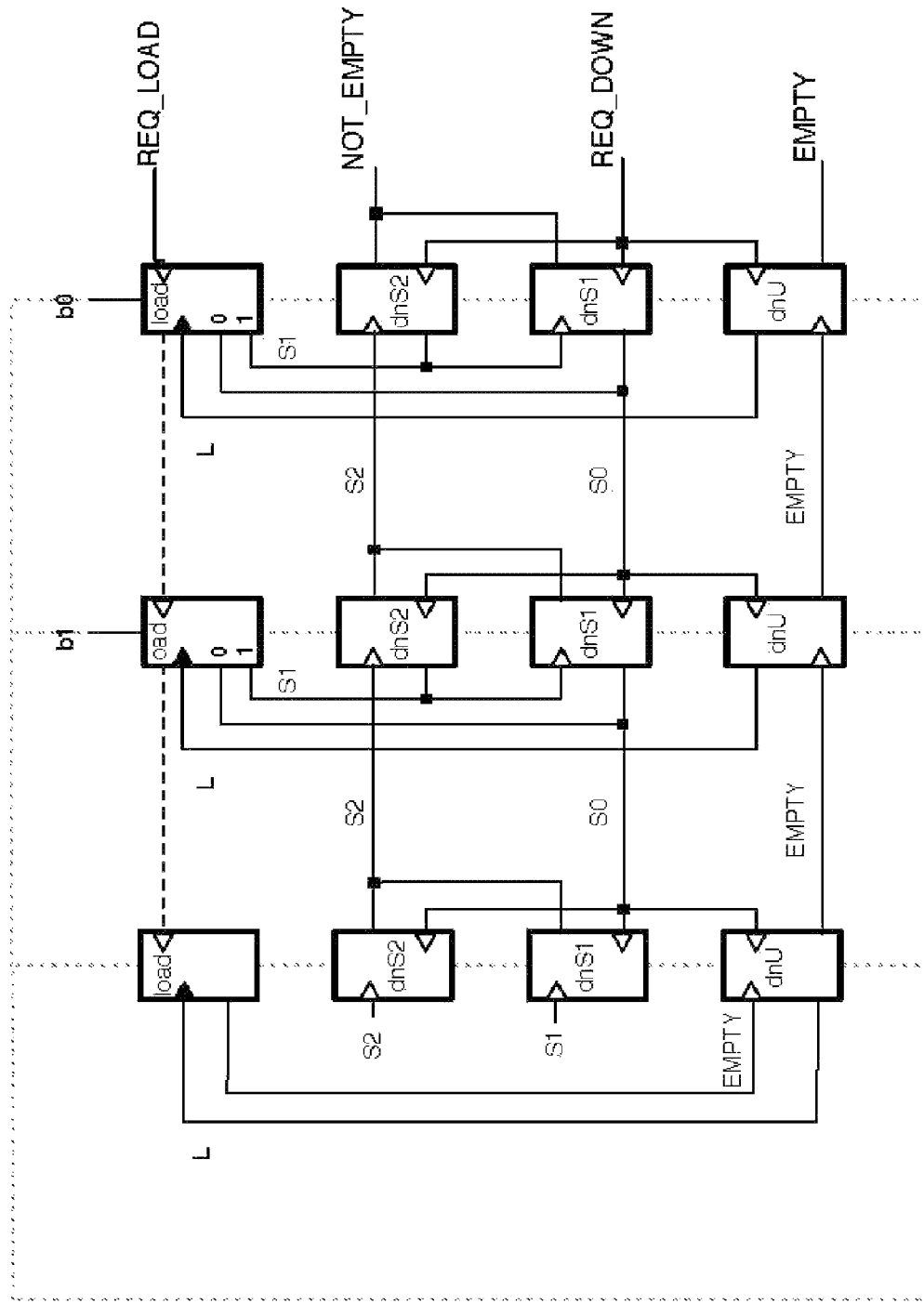
FIG. 5 shows an implementation of a 2-bit loadable down counter in accordance with an embodiment of the present invention.

FIG. 5 gives a complete implementation of a 2-bit loadable down counter using a one-hot state encoding in accordance with some embodiments of the present invention. Our implementation of the counter has the property that the load actions can be activated concurrently for all cells or sequentially as indicated in FIG. 4B. Furthermore, the user may initiate a load and a down request concurrently without causing any malfunction. The implementations of FIGS. 4A-4D have the property that the first down action can be performed only after a load action has completed.

Figure 7B:
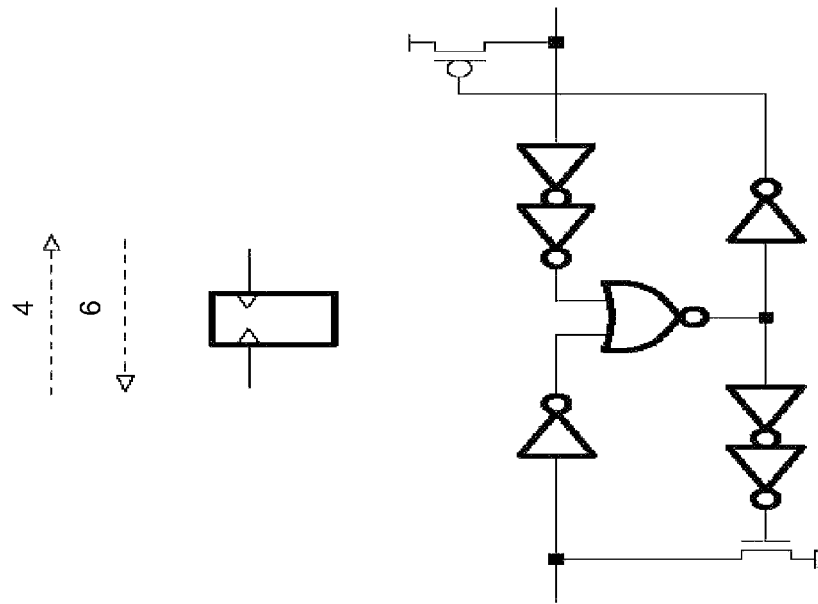
FIG. 7B shows an example of a 4-6 GasP implementation in accordance with an embodiment of the present invention.
Figure 7A:
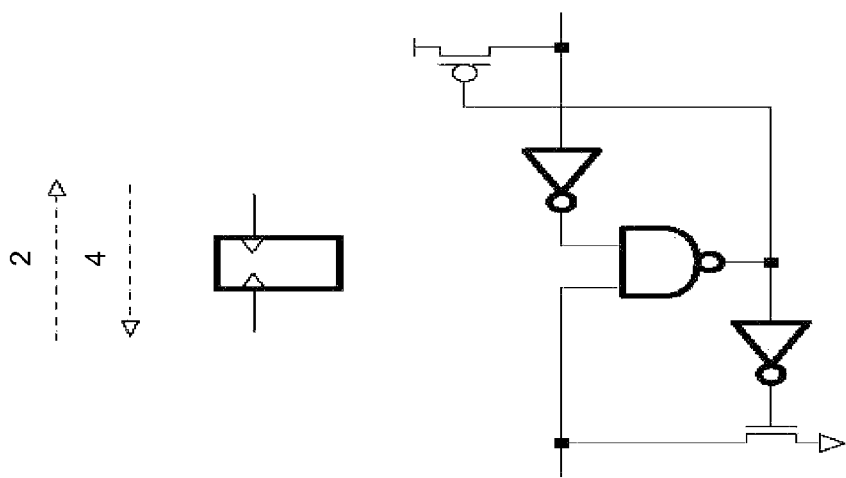
FIG. 7A shows an example of a 2-4 GasP implementation in accordance with an embodiment of the present invention.

There are several ways that the GasP modules can be implemented. There is a 2-4 GasP implementation, as in FIG. 7A, and there is a 4-6 GasP implementation as in FIG. 7B in accordance with some embodiments of the present invention. There are many more variants. The 2-4 GasP implementation has a cycle time of 6 gate delays, and the 4-6 GasP implementation has a cycle time of 10 gate delays.

The state wires should be kept at the appropriate voltage when they are not actively driven. There are several ways to do this. One alternative is to have one full-keeper per state wire. This alternative has the advantage of using only one keeper per state wire and the disadvantage of needing to overdrive the keeper every time the state changes. A second alternative is to have a half-keeper at every end of the state wire, provided that there are only two GasP modules that can change the state of the state wire. The first GasP module only pulls up the state wire, and the second GasP module only pulls down the state wire. The disadvantage is that you need two half-keepers, but the advantage is that you do not need to overdrive the keeper when changing a state wire. Implementations of half-keepers and full-keepers have been discussed by others and are well-known in the art. Unfortunately, in the implementation of FIGS. 4A-4D, the states S0, S1, and S2 have more than two GasP modules that drive the state wire, which excludes the use of half-keepers for these state wires.

Figure 6:
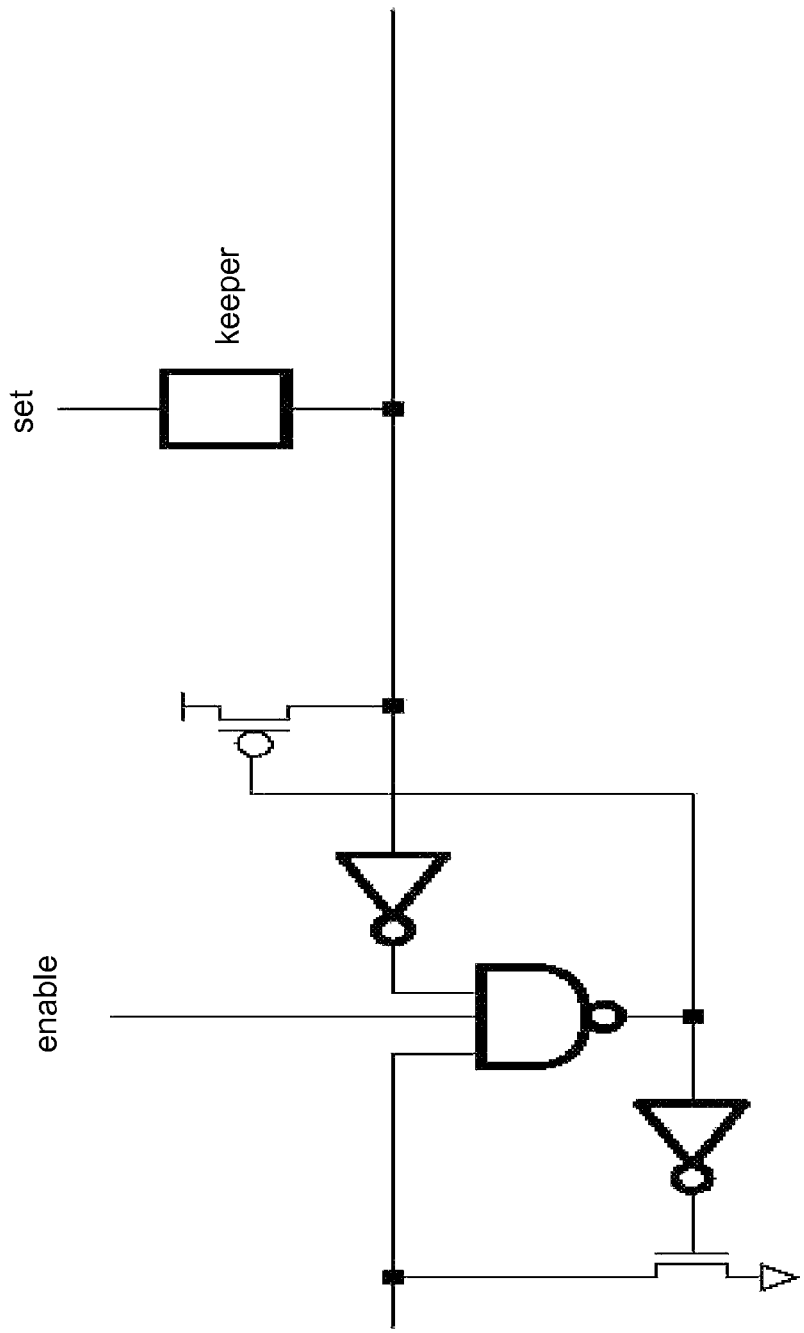
FIG. 6 shows initialization of state wires by means of an enable signal and setting keepers in accordance with an embodiment of the present invention.

Initialization of a GasP implementation occurs by setting the values of the state wires to the appropriate state. One way to initialize the state wires is first to disable all GasP modules by disabling the fire action through the NAND gate as in FIG. 6, and second to set the keepers of the state wires to the appropriate value.

Kessels's counter has been implemented as part of a chip using a one-hot encoding. Since the chip was using 4-6 GasP, the implementation includes a 32-bit down counter also using 4-6 GasP in TSMC 90n technology. The cycle time of the counter was 390 ps.

The one-hot encoding uses one wire per state. Furthermore, each state transition maps to a GasP module with two in-out ports, one for each of the neighboring cells. The next section explores a state encoding that uses multiple wires per state.

When each state is encoded by two wires instead of one, the implementation of each state transition in Table 2 needs as input the two state wires from each neighbor. In fact, all state transitions may be implemented with just one generalized GasP module. The idea is to have an implementation similar to FIG. 8B, which represents a generalized 2-4 GasP module with two gate delays in the forward direction and four gate delays in the reverse direction, in accordance with some embodiments of the present invention. In order to obtain a forward delay of 2 and reverse delay of 4, each rectangle represents logic that experiences only 1 gate delay. The blocks labeled "pu" represent pull-up logic and the blocks labeled "pd" represent pull-down logic. The central block labeled "fire" implements the firing condition, which depends on the state transition and the state encoding in Table 2. The other blocks implement the transitions to the correct final state by activating the correct pull-up and pull-down logic. The complexity of each block depends on the chosen state encoding. FIG. 8C represents a generalized 4-6 GasP module with four gate delays in the forward direction and six gate delays in the reverse direction, in accordance with some embodiments of the present invention.

To illustrate the idea, consider the encoding of Table 3 that uses only two wires, viz., w0 and w1, in accordance with some embodiments of the present invention. The state encoding of Table 3 leads to the following firing rules and implementation rules for pull-up and pull-down blocks for a GasP module.

TABLE 3

State encoding using two wires

| bit value | $w_0$ | $w_1$ |
|---|---|---|
| EMPTY | 0 | 1 |
| S0 | 0 | 0 |
| S1 | 1 | 0 |
| S2 | 1 | 1 |

Notice that in this state assignment, LSN0 and LSN1 are only pulled up, and MSN0 and MSN1 are only pulled low. Table 4 leads to the following conditions for pulling down MSN0 and MSN1 and pulling up LSN0 and LSN1 in accordance with some embodiments of the present invention.

| fire = | (¬ LSN0 ∧ ¬ LSN1) ∧ (MSN0 ∨ MSN1) |
|---|---|
| pull down MSN0 = | fire ∧ ¬ MSN1 |
| pull down MSN1 = | fire ∧ MSN0 |
| pull up LSN0 = | fire ∧ MSN0 |
| pull up LSN1 = | fire |

TABLE 4

State transitions with new state encoding

| Before firing | | After firing | |
|---|---|---|---|
| MSN | LSN | MSN | LSN |
| EMPTY = 01 | S0 = 00 | EMPTY = 01 | EMPTY = 01 |
| S1 = 10 | S0 = 00 | S0 = 00 | S2 = 11 |
| S2 = 11 | S0 = 00 | S1 = 10 | S2 = 11 |
| S0 = 00 | S0 = 00 | S0 = 00 | S0 = 00 |

Figure 9:
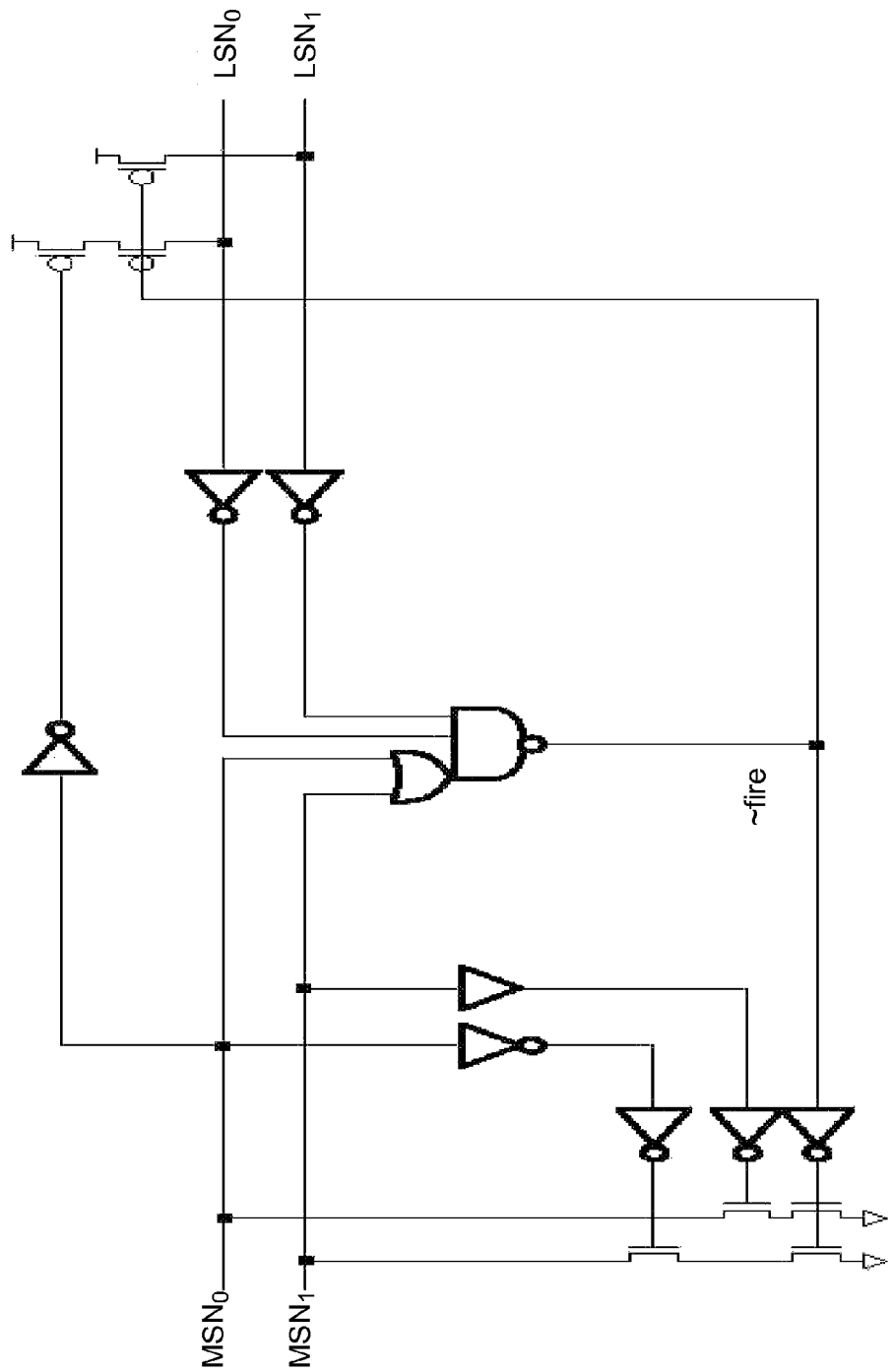
FIG. 9 shows an implementation of a generalized 2-4 GasP module with a state encoding using two wires in accordance with an embodiment of the present invention.
Figure 10:
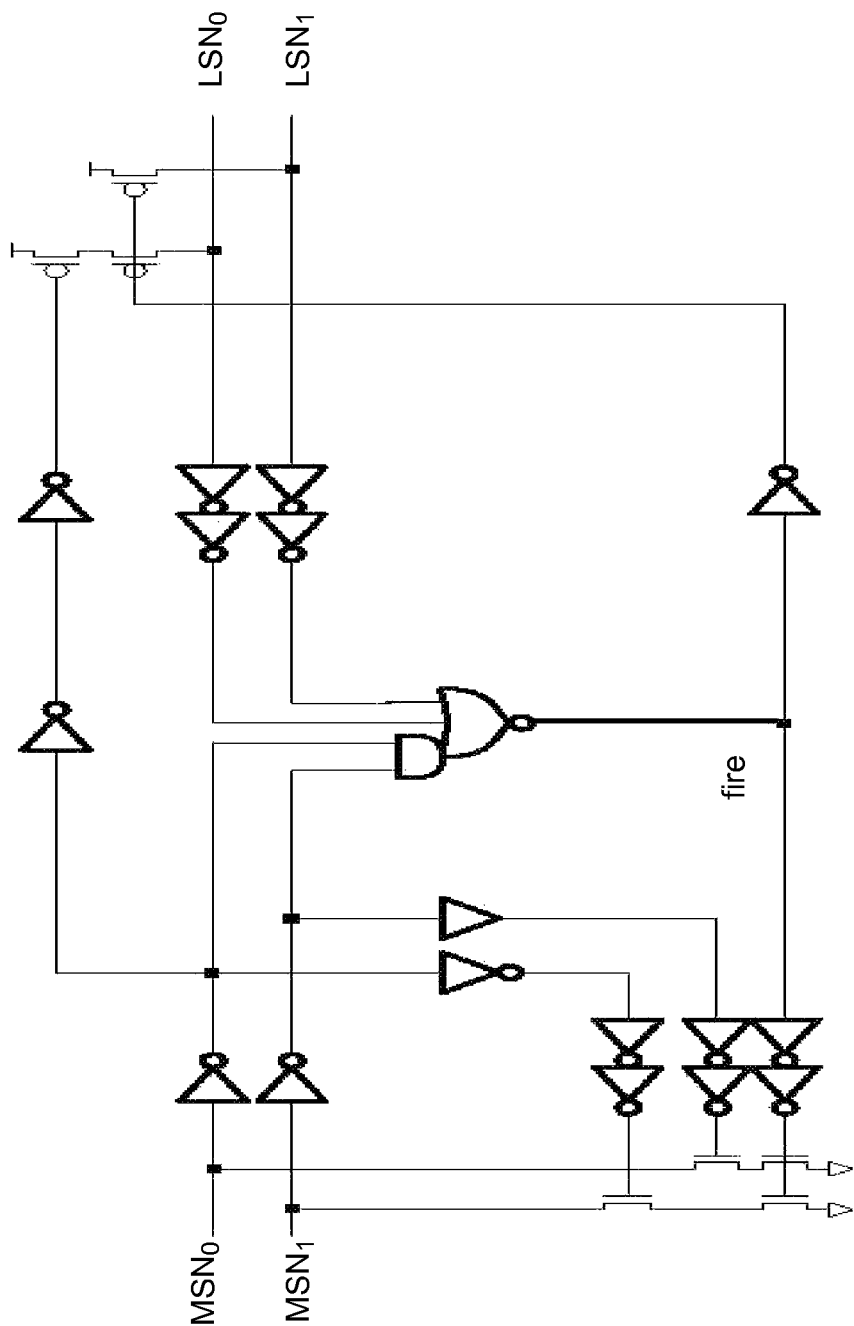
FIG. 10 shows an implementation of a generalized 4-6 GasP module with a state encoding using two wires in accordance with an embodiment of the present invention.

The 2-4 GasP implementation appears in FIG. 9 in accordance with some embodiments of the present invention. A 4-6 GasP implementation appears in FIG. 10 in accordance with some embodiments of the present invention.

The end cell is always in state EMPTY. The implementation is simple: during loading, the system sets the state of the end cell to EMPTY by initializing the two state wires $w_0 w_1$ to 01. The next section discusses the loading of the cells and initialization. A complete implementation of a 2-bit counter with generalized GasP modules appears in FIG. 11 in accordance with some embodiments of the present invention, where each GasP module is implemented as in FIG. 9 or FIG. 10.

In the implementation for the one-hot state encoding, to the specification includes the loading of the count value with an explicit load action. In that specification, the counter can be loaded with a new value only when the EMPTY state has been reached. In a number of applications, it may be convenient to load the counter in other states as well. For this reason the implementation allows the loading of a new value at any quiescent state.

The loading of a new value is similar to the initialization of the counter, but instead of initializing the counter to one state only, the counter can be initialized to any state. The initialization and loading of the counter consists of first disabling the firing of the GasP modules and then setting the state wires to the proper value. Disabling the firing of the GasP module can be done by adding an extra input "enable" to the OAI gate similar to the extra input to the NAND gate in FIG. 6. The state wires are initialized similar to FIG. 6 by setting the keepers to the proper values.

An advantage of the state encoding using multiple state wires per state, instead of a one-hot encoding, is that there will be fewer keepers and less initialization circuitry. A further advantage of this state encoding is that the system can use half-keepers at the pull-up and pull-down transistors, because one side of each state wire will only pull up the state wire and the other side will only pull down the state wire. Because the system does not need to overdrive half-keepers, the use of half-keepers will result in lower power consumption.

To guarantee correctness, there are several restrictions that apply to implementations using a state encoding with multiple wires.

First, there are the delay constraints. Assume that each gate experiences about the same delay. This delay constraint also applies to traditional GasP circuits. In the generalized GasP implementations, when you connect a state wire to a conditional input in the pull-up logic or the pull-down logic, there are some additional delay constraints. Each loop must have three gate delays, when using 2-4 GasP, or five gate delays, when using 4-6 GasP. Furthermore, each path from MSN to LSN must have two gate delays in 2-4 GasP (and four gate delays in 4-6 GasP), and each path from LSN to MSN must have four gate delays in 2-4 GasP (and six gate delays in 4-6 GasP).

Second, there is the condition that state transitions must be nearly instantaneous. In case multiple wires encode a state and only one wire changes in a state transition, then the state transition can be considered instantaneous. If, however, multiple wires change in a state transition, all wires must change at nearly the same time, such that any neighbor observes a single state transition rather than a sequence of state transitions. Non-instantaneous state transitions may cause a malfunction. For example, when a state must change from S0=00 to S2=11 and the state wires do not change simultaneously, then the neighboring cell may observe first state EMPTY=01 and then state S2=11, or first state S1=10 and then state S2=11. If the duration of the intermediate state is long enough, a malfunction may occur in the neighboring cell.

The difficulty of meeting the requirement of instantaneous state changes depends on the choice of state encoding and the difficulty of meeting the delay requirements in the implementation. As for the state encoding, note that the one-hot assignment satisfies the requirement that state changes are instantaneous, since only a single state wire becomes active in each state transition. It may be possible to find other state encodings such that only a single state wire changes in each state transition. As for the delay requirement, making sure that all state wires change nearly simultaneously may be done by ensuring that the last signal to enable the pull-up and pull-down transistors is always the fire signal.

Figure 11:
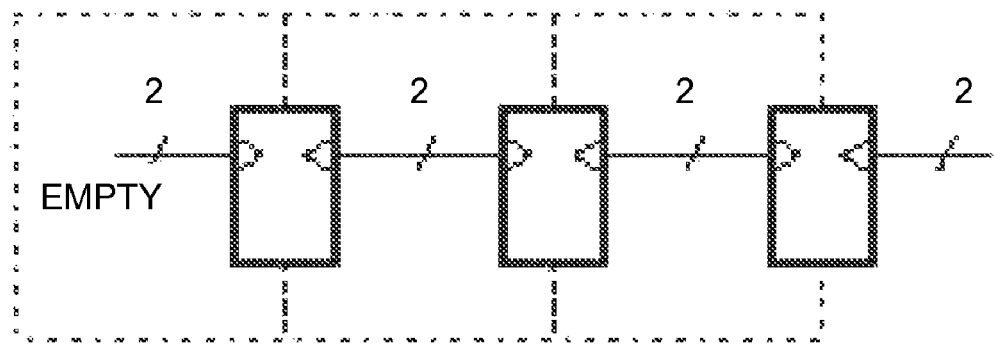
FIG. 11 shows a 2-bit implementation of a counter using a state encoding with two wires per state in accordance with an embodiment of the present invention.

Because of these delay constraints and the requirement that state transitions must be instantaneous, the implementation of FIG. 11 is less robust than the one-hot implementation of FIG. 4.

When using a general state encoding rather than a one-hot state encoding, there can be large area savings if the number of states is large and there are relatively few state transitions. The area savings for our example, however, is small, if any. Although the area is determined more by the actual sizes of the gates, note that the implementation of FIG. 9 has 1 OAI gate, 7 inverters, 1 buffer, and 4 NMOS and 3 PMOS transistors per cell. Our one-hot implementation has 4 NAND gates, 8 inverters, and 4 PMOS and 4 NMOS transistors per cell.

The settling time after a load action is the time needed before the first down action can be performed. The worst-case settling time occurs when you load a 0 into the counter and the bit value E has to propagate from the end cell to the first cell. Thus, the settling time in the worst case may take a time proportional to the number of bits in the counter. During the design phase, you may want to make this worst-case settling time as short as possible. For this reason, the system uses a forward delay of two gate delays, instead of four gate delays, for the implementation of the 2-4 GasP modules. The average-case settling time, however, is only twice the forward delay of a cell, if you do a broadcast load.

Once the counter is counting down, each decrement can be done within the cycle time of the counter.

The power consumption of the counter is very low. Notice that for each cell and for each two communication actions with the less significant neighbor, there is at most one communication action with the more significant neighbor. This property guarantees that the power consumption of the counter per decrement is bounded by a constant.

A 6-4 GasP version of the counter has been implemented as in FIGS. 4A-4D in 90 nm TSMC as part of a chip. The cycle time of this counter is 390 ps and power consumption per decrement is around 0.7pJ. A 2-4 GasP version has also been simulated using a state encoding as in FIG. 11. The cycle time from back-annotated layout of this counter is 76 ps.

Kessels's down counter is a convenient down counter when it comes to implementing finite repetitions. It is simple, easy to explain, and can achieve a fast cycle time of six gate delays. The counter has a worst-case settling time proportional to the number of bits, but a constant average settling time of around four gate delays when using 2-4 GasP and a broadcast load. The average power consumption per decrement is also constant.

One difference between our implementations and synchronous implementations is the absence of a clock, which results in a lower power consumption. In fact, dynamic power is only consumed when a decrement occurs. When there are no decrements, our asynchronous down counter consumes no dynamic power. Other differences between our implementations and Kessels's asynchronous implementation is that our implementations are based on GasP, have a smaller cycle time, a smaller settling time, and consume less power, whereas Kessels's counter is based on silicon compilation from the language Tangram to a standard cell implementation.

The state encodings using multiple state wires can potentially save much area over the one-hot state encodings. There are, however, some restrictions that need to be satisfied as has been already explained.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes.

Note that the methods and processes can be embodied using a combination of code, data, and hardware modules or apparatuses. The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An asynchronous down counter, comprising:
an array of cells, wherein each cell in the array is configured to hold a digit in a redundant base-k representation of a number contained in the array of cells;
wherein each cell comprises a finite state machine that defines state transitions between states, wherein states are held on wires and state transitions are synchronized between adjacent cells; and
wherein each cell is configured to asynchronously borrow from a more significant adjacent cell to increase a value of a digit in the cell, wherein the asynchronous borrowing improves performance by ensuring that a decrement operation, which decrements a digit in a least significant cell in the array, will borrow from an adjacent more significant cell, without having to wait for the completion of a rippling sequence of borrows from more significant cells.

2. The asynchronous down counter of claim 1, wherein each digit in the redundant base-k representation of a number is a redundant base-2 digit.

3. The asynchronous down counter of claim 1, further comprising a loading circuit configured to load a number N into the array of cells.

4. The asynchronous down counter of claim 1, wherein the finite state machine in each cell is configured to encode each state on a single wire.

5. The asynchronous down counter of claim 1, wherein the finite state machine in each cell is configured to encode each state on multiple wires.

6. The asynchronous down counter of claim 1, wherein each cell includes a GasP module that implements one or more state transitions for the cell.

7. The asynchronous down counter of claim 6, wherein the GasP module is implemented by a 2-4 GasP circuit, wherein the circuit has two gate delays in the forward direction and four gate delays in the reverse direction, and wherein the circuit has a cycle time of six gate delays.

8. The asynchronous down counter of claim 1, wherein a state wire is maintained at a current state by a keeper circuit when the wire is not actively driven.

9. A method for operating a down counter, comprising:
receiving an input, wherein the input is n digits in length and wherein each digit is a base-k digit;
storing the input into an array of cells;
at each cell in the array, borrowing asynchronously from a more significant adjacent cell to increase a value of the digit in the cell; and
iteratively decrementing the contents of the array, wherein each iteration involves:
decrementing a least significant cell; and
wherein the asynchronous borrowing concurrently decrements more significant cells in the array.

10. The method of claim 9, wherein each digit in the redundant base-k representation of a number is a redundant base-2 digit.

11. The method of claim 9, wherein each cell includes a GasP module that implements one or more state transitions for the cell.

12. The method of claim 9, wherein a wire is maintained at a current state by a keeper circuit when the wire is not actively driven.

13. A computer system for counting iterations, comprising:
a processor;
a memory; and
a down counter configured as an array of cells, wherein each cell in the array is configured to hold a digit in a redundant base-k representation of a number contained in the array of cells;
wherein each cell comprises a finite state machine that defines state transitions between states, wherein states are held on wires and state transitions are synchronized between adjacent cells; and
wherein each cell is configured to asynchronously borrow from a more significant adjacent cell to increase a value of a digit in the cell, wherein the asynchronous borrowing improves performance by ensuring that a decrement operation, which decrements a digit in a least significant cell in the array, will borrow from an adjacent more significant cell, without having to wait for the completion of a rippling sequence of borrows from more significant cells.

14. The computer system of claim 13, wherein each digit in the redundant base-k representation of a number in the down counter is a redundant base-2 digit.

15. The computer system of claim 13, wherein the down counter further comprises a loading circuit configured to load a number N into the array of cells.

16. The computer system of claim 13, wherein the finite state machine in each cell of the down counter is configured to encode each state on a single wire.

17. The computer system of claim 13, wherein the finite state machine in each cell of the down counter is configured to encode each state on multiple wires.

18. The computer system of claim 13, wherein each cell of the down counter includes a GasP module that implements one or more state transitions for the cell.

19. The computer system of claim 18, wherein the GasP module is implemented by a 2-4 GasP circuit, wherein the circuit has two gate delays in the forward direction and four gate delays in the reverse direction, and wherein the circuit has a cycle time of six gate delays.

20. The computer system of claim 13, wherein a state wire is maintained at a current state by a keeper circuit when the wire is not actively driven.

* * * * *